(12) United States Patent
Rangachari et al.

(10) Patent No.: US 9,929,744 B2
(45) Date of Patent: Mar. 27, 2018

(54) MEMORY COMPRESSION OPERABLE FOR NON-CONTIGUOUS WRITE/READ ADDRESSES

(71) Applicant: Texas Instruments Incorporated, Dallas, TX (US)

(72) Inventors: Sundarrajan Rangachari, Trichy (IN); Desmond Pravin Martin Fernandes, Bangalore (IN); Rakesh Channabasappa Yaraduyathinahalli, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/782,052

(22) Filed: Oct. 12, 2017

(65) Prior Publication Data

US 2018/0041222 A1 Feb. 8, 2018

Related U.S. Application Data

(63) Continuation of application No. 14/814,617, filed on Jul. 31, 2015, now abandoned.

(30) Foreign Application Priority Data

Oct. 17, 2014 (IN) .......................... 5194/CHE/2014

(51) Int. Cl.
*G06F 12/00* (2006.01)
*H03M 7/30* (2006.01)

(52) U.S. Cl.
CPC ........... *H03M 7/30* (2013.01); *H03M 7/6047* (2013.01); *G06F 2212/401* (2013.01)

(58) Field of Classification Search
CPC .. H03M 7/30; H03M 7/6047; G06F 2212/401
See application file for complete search history.

*Primary Examiner* — Larry T MacKall
(74) *Attorney, Agent, or Firm* — Kenneth Liu; Charles A. Brill; Frank D. Cimino

(57) ABSTRACT

Disclosed embodiments include a system having a first memory for storing a plurality of data quantities, each data quantity consisting of a first number of bits, and a second memory for storing a plurality of compressed data quantities, each compressed data quantity consisting of a second number of bits that is less than the first number of bits. The system includes circuitry for reading data quantities from the first memory and for writing compressed data quantities, corresponding to respective read data quantities, to non-sequential addresses in the second memory. The circuitry for reading data quantities from the first memory is for reading along a read orientation selected from one of row-orientation or column-orientation from the first memory, and the circuitry for writing compressed data quantities in the second memory is for writing along a write orientation in the second memory that differs from the read orientation.

19 Claims, 5 Drawing Sheets

MEMORY COMPRESSION OPERABLE FOR NON-CONTIGUOUS WRITE/READ ADDRESSES

CROSS-REFERENCES TO RELATED APPLICATIONS

This application is a continuation of and claims priority to U.S. patent application Ser. No. 14/814,617 filed on Jul. 31, 2015, which claims priority to India Provisional Patent Application 5194/CHE/2014, entitled "NOVEL MEMORY COMPRESSION TECHNIQUE FOR NON-CONTIGUOUS WRITE/READ ADDRESSES" and filed Oct. 17, 2014, the entireties of which are incorporated herein by reference.

STATEMENT REGARDING FEDERALLY SPONSORED RESEARCH OR DEVELOPMENT

Not Applicable.

BACKGROUND

The preferred embodiments relate to digital data storage and retrieval and, more particularly, to memory compression of such data.

Digital data systems include memory into which data is written and from which data is read. A single system may have access to multiple memories for various reasons, where one common approach is the use of multiple levels of cache memory. For example, a processor may access several cache memories, typically described as levels and labeled with the letter "L" followed by an integer, where the lowest level L1 is typically fastest to access, followed by L2, then possibly L3 and so forth. For these and other memories, the availability of space, access time, and competition of resources involves various efficiency considerations, and one such consideration involves what is referred to as memory compression.

Memory compression often arises where it is desired to sample less than, or otherwise reduce the size of, an entire data quantity that is read from a first memory, where a smaller data counterpart, such as a sampled (e.g., truncated) portion of the original, is then written into a second, destination memory so that multiple of the original (larger) data counterparts are thereby "compressed" by fitting them into smaller memory space in the second memory. Solely by way of a numeric example and for sake of later discussion, assume for example that data is provided from a first memory (e.g., L1 cache) in 32-bit quantities, but only 18 bits of each quantity are relevant to an analysis; each 18 bit subset, or representation, of a 32-bit quantity represents a compressed data "sample," and assume further it is desired to compress multiple 18-bit samples into a 128-bit wide destination memory (e.g., L2 or L3 cache). As a result, up to seven 18-bit data samples may be combined into a total of 126 bits, and those 126 bits of compressed data are stored into a single 128-bit memory location in the destination memory.

In the prior art, compressing original data into samples is typically achieved by receiving incoming data samples into a temporary buffer that is the size of a memory line (or row) in the destination memory. When the temporary buffer is filled with the maximum number of compressed samples that it can hold, the entire buffer is written into a memory row in the destination memory. In the example above, therefore, a 128 bit temporary buffer is used. As an example of its operation, therefore, assume seven 18-bit data samples arrive, so each is stored in the temporary buffer, providing a total of 126 bits. When the eighth 18-bit sample arrives, the remaining portion of the 128-bit temporary buffer is filled, that is, two least significant bits (LSBs) from the eighth data sample are also input to the temporary data buffer, and the 128-bits then stored in the temporary data buffer are written to the destination memory row, thereby compressing the seven data samples, along with two bits from the eighth data sample, into one memory row (or "word") of the destination memory. Note also in this example that, for the eighth data sample, 2 of its bits were written, while 16 of its bits remain unwritten. These remaining 16 bits, therefore, are next stored in the 128-bit temporary buffer, which will then await receipt of 112 next bits (i.e., from six of the next 18-bit data samples, along with 4 bits from a seventh such sample), and when it is filled again, another write into the next sequential address of the destination memory is performed, and the process repeats as needed or desired for additional compressed data samples. Given the preceding, note therefore, that the temporary buffer requires a "history" of data, that is, a delay while data from samples are received into the buffer. Once this history is achieved, the write to memory occurs. Moreover, the above process repeats for each set of data samples, and the results are always written into sequential memory addresses. Lastly, note that the prior art also uses a temporary buffer in the reverse, or decompression, data path. In a comparable manner, therefore, compressed data values are written and decompressed into the buffer, after which the decompressed values are written to sequential addresses in another memory (e.g., the source memory from which data was sampled for earlier compression).

While the above prior art approach has proven workable in various systems and architectures, the present inventors have observed various drawbacks. As one example, the prior art approach is necessarily constrained to writing to successive addresses in the destination memory. Such a result may have limitations in applications where non-sequential compression is desired, that is, writing into memory locations that are not contiguous. For example, in some applications, data from one source is required to be transposed into its destination, such as reading in row order and storing in column order; the prior art, therefore, cannot accommodate memory compression in such an application. As another example, the prior art requires a necessary delay as the buffer accumulates the "history" of multiple data samples.

Given the preceding, the present inventors seek to improve upon the prior art, as further detailed below.

SUMMARY

In certain disclosed embodiments, there is a digital data storage and retrieval system. The system comprises a first memory for storing a plurality of data quantities, and each data quantity, in the plurality of data quantities, consists of a first number of bits. The system also comprises a second memory for storing a plurality of compressed data quantities, and each compressed data quantity, in the plurality of compressed data quantities, consists of a second number of bits that is less than the first number of bits. The system also comprises circuitry for reading data quantities from the first memory and circuitry for writing compressed data quantities, corresponding to respective read data quantities, to non-sequential addresses in the second memory.

Numerous other inventive aspects are also disclosed and claimed. For example, another aspect includes circuitry for reading compressed data quantities from the second memory, and circuitry for writing decompressed data quantities, corresponding to respective read compressed data quantities, to non-sequential addresses in the first memory. Numerous other examples are provided in this document.

DETAILED DESCRIPTION

Figure 1:
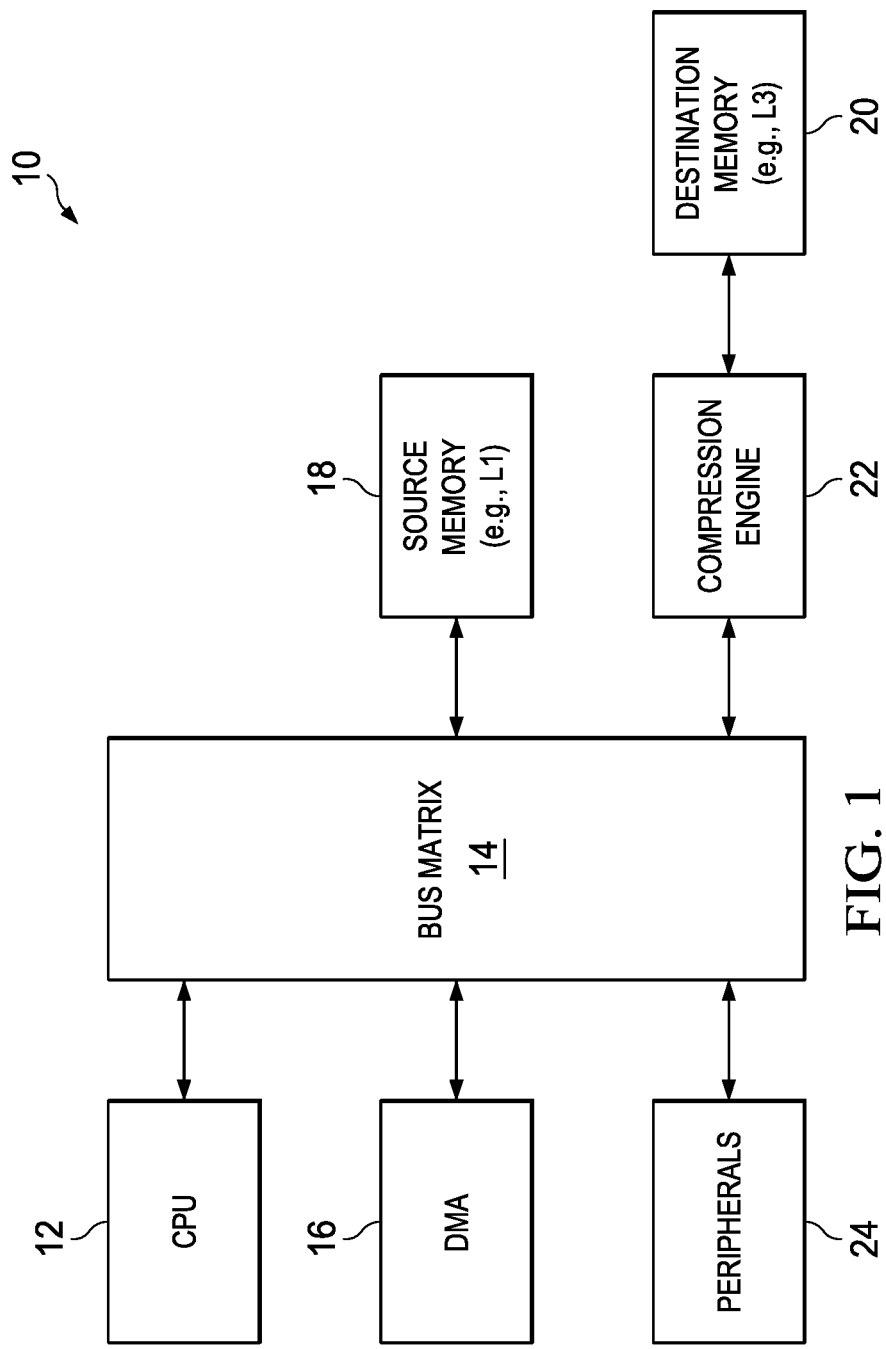
FIG. 1 illustrates a block diagram of a digital information system improved in connection with the preferred embodiments.

FIG. 1 illustrates a block diagram of a digital information system 10 that in the general block form is known in the art, but as is also improved in connection with the preferred embodiments as detailed below. As one skilled in the art will readily understand certain matters, only a brief background is provided. System 10 may be implemented in connection with various computing architectures, including single and multiple chip or board devices. System 10 includes a CPU 12 or other processor(s) that receives data, processes it, and provides outputs. Moreover, while CPU 12 is shown as a separate block in FIG. 1, this is intended as a functional and not necessarily architectural border, as one more of the other items in FIG. 1 may be on the same integrated circuit as CPU 12.

The data of system 10 in general is read/written via a bus matrix 14, so as to communicate data with any other block connected to matrix 14. In this regard, such data may be communicated using CPU 12, or often via the control of a separate Direct Memory Access (DMA) controller 16, which can thereby control data transfer separate from, and so as to free up resources of, CPU 12. Thus, DMA-controlled data may be moved between a source memory 18, via bus matrix 14, and a destination memory 20; in the context of the preferred embodiments, the data so moved preferably passes through a compression engine 22 which is operable to compress data as between memories 18 and 20. In this regard, one typical example exists where source memory 18 is a low level (e.g., L1) cache memory, while destination memory 20 is a higher level (e.g., L2 or L3) cache memory. Due to the relative sizes, speed of access, and other considerations with respect to the memories 18 and 20, compression in the general manner described above may be desired, and is further achieved as detailed below. The preferred embodiments, also provide for decompression of previously-compressed data. Thus, in the example of FIG. 1 where data from source memory 18 is previously compressed and written into destination memory 20, then thereafter such data may be read from destination memory 20, decompressed (such as by padding with zeroes, or by sign extension when appropriate), and then written to another memory, such as back to source memory 18. Thus, other blocks in Figured 1, such as CPU 12, DMA 16, and Bus Matrix 14 are exposed only to uncompressed data. Lastly in completing FIG. 1, other devices may access system 10, and such devices are therefore intended to be generally represented as peripherals 24.

Compression engine 22 of FIG. 1 is now explored in greater detail, including in connection with additional Figures. In general, compression engine 22 includes circuitry operable to compress multiple data quantities, each having a same size, from source memory 18 to a smaller sample size for storage in destination memory 20. Typically a number of such compressed data samples are stored in a single line in the destination memory (e.g., memory 20). As demonstrated below, however, the preferred embodiment further enables the ability to store different compressed data samples on different data rows. In any event, the compression occurs in that an original data quantity has a number of bits, and then a corresponding compressed data sample, having a fewer number of bits as compared to the original, is stored. Moreover, the preferred embodiment permits the original to be taken from either contiguous or non-contiguous locations in source memory 18 and to be stored in either contiguous or non-contiguous locations in destination memory 20. Each of these aspects is further explored below.

Figure 2:
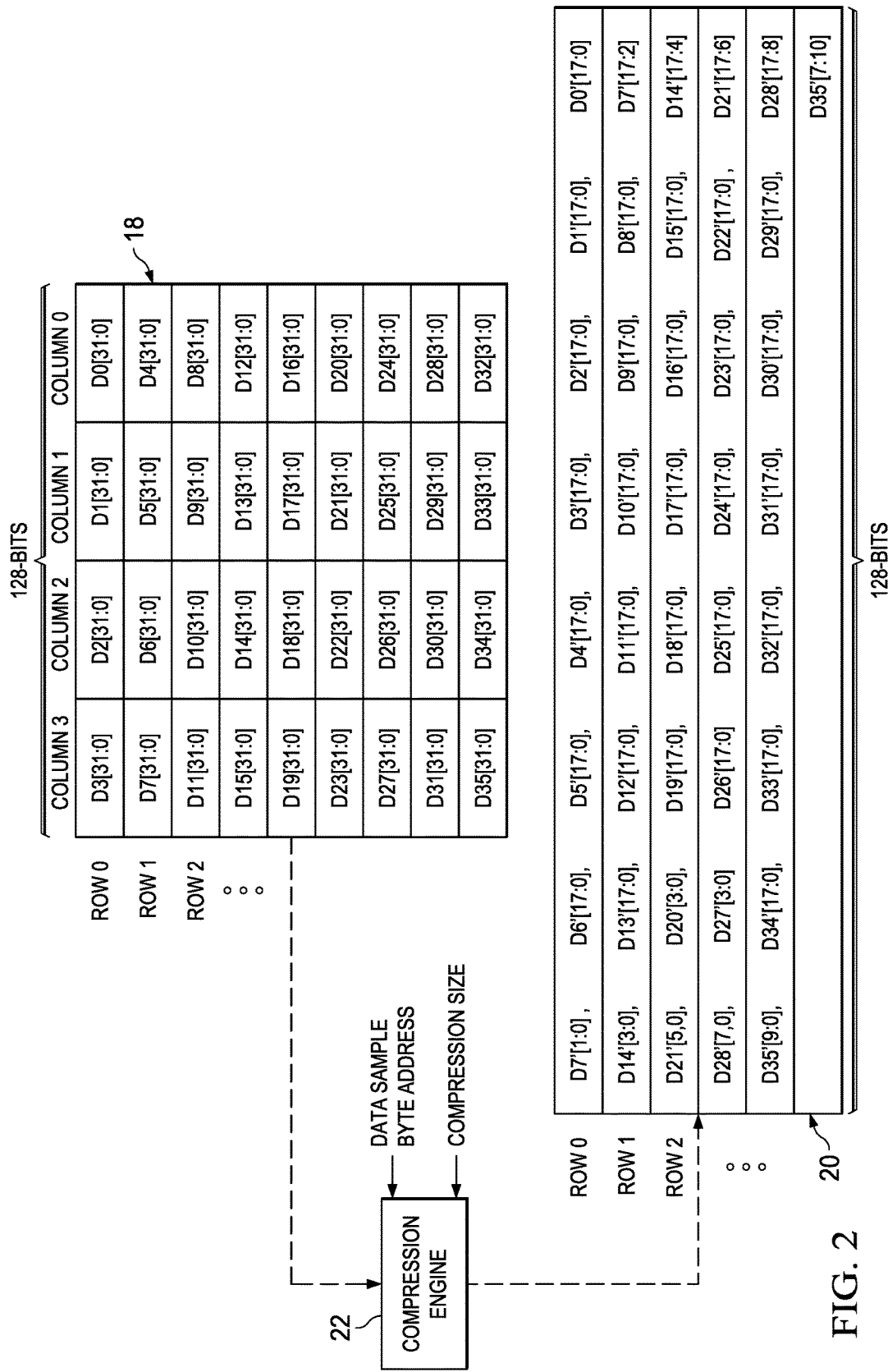
FIG. 2 illustrates a functional block diagram of source memory, destination memory, and compression engine, with row reading from the source memory and compressed row writing into the destination memory.

FIG. 2 illustrates a functional block diagram of source memory 18, destination memory 20, and compression engine 22, from FIG. 1, with other aspects from FIG. 1 not repeated in FIG. 2 so as to simplify the illustration. Moreover, a dashed arrow is generally shown from source memory 18 to destination memory 20, with compression engine 22 between them, so as to control the compression storage aspects as will be understood in the remainder of this document. Attention now turns to the example illustrated in FIG. 2 and various conventions used in this document.

In the example of FIG. 2, source memory 18 has a number of memory rows, often referred to in the art as storing respective "words," each of which is 128 bits wide, that is, operable to store 128 bits. For convention and reference, the rows are numbered 0, 1, 2, and so forth, starting from the top row in the Figure. Each 128-bit row stores four, 32-bit data quantities. The top such row, therefore, stores data quantities, shown from right to left, as D0, D1, D2, and D3, each having 32 bits shown by the convention of [31:0], with bit 0 being the least significant bit (LSB) and bit 31 being the most significant bit (MSB). With these conventions, therefore, one skilled in the art will understand that source memory 18 stores a total of 36 data quantities, each having 32 bits.

Further in the example of FIG. 2, the data quantities from source memory 18 are compressed and stored into destination memory 20, where each data sample is read along a row and each compressed counterpart data sample is also stored along a row. Destination memory 20, by way of example, has a number of memory rows (again, often referred to as "words"), each of which is 128 bits wide, that is, operable to store 128 bits. However, by way of illustrating the preferred embodiment compression, each 32-bit data quantity from source memory 18 is processed into a smaller number of bits, where in the example of FIG. 2 the number, or "compression size," is 18 bits. Further in this regard, note that FIG. 2 illustrates two parameters as information input, or otherwise available, to compression engine 22, namely: (1) COMPRESSION SIZE; and (2) DATA SAMPLE BYTE ADDRESS. The first parameter is above described (e.g., 18 bits). The second parameter is a base number that, in combination with other factors detailed herein, locates the compressed data quantity at a location in destination memory 20 based in part on the size of its uncompressed counterpart (e.g., 32 bits in the present example). With a more precise understanding of this second parameter as described below, it may be implemented, for example, by calculations of DMA controller 16 in FIG. 1.

As a first example of the compression and storage, consider a first read of the 32-bit data quantity D0[31:0] at the LSBs in row 0 of source memory 18. Since the 18-bit counterpart to D0[31:0] is the first sample to be written in destination memory 20, then it is directed to the lowest-ordered data location in row 0. Further, with the present example having a compression size of 18, then the counterpart, compressed 18-bit data sample D0'[17:0] is written as the LSBs in row 0 of destination memory 20. Additional detail is provided later as to the address location of the stored compressed sample.

As a second example of the compression and storage, consider a next read of the 32-bit data quantity D1[31:0] in source memory 18, located at the next significant memory location relative to D0[31:0]. In this case, since writing is by row, and with a first compressed 18-bit data sample D0'[17:0] having been written and with it desired that the second compressed 18-bit data sample D1'[17:0] be written next to the first (and in the next more significant location), then the DATA SAMPLE BYTE ADDRESS is increased as detailed below so as to achieve the write at the desired location. As further appreciated below, therefore, for data sample D1[31:0] in source memory 18, a counterpart, compressed 18-bit data sample D1'[17:0] is stored as the next most significant data adjacent the LSBs of D0'[17:0] in row 0 of destination memory 20. Various other examples will be apparent to one skilled in the art.

Continuing with the example illustration of FIG. 2, additional detail is now introduced as to the storage positions of the compressed data in destination memory 20. First, recall that for each 32-bit data quantity Dx[31:0] in source memory 18, an 18 bit sample of counterpart Dx'[17:0] is stored in destination memory 20. Note further, however, that because destination memory 20 is 128 bits wide, then 126 bits in each of its 128-bit rows can store up to seven full-sized18-bit counterparts (i.e., 7*18=126 bits), but therefore there are two excess bits, after which the row is full. By way of example of this aspect, consider the first row of destination memory 20. In it, there are seven full 18-bit compressed data values D0' through D6', spanning a total of 126 bits. For the compressed data value D7', therefore, the first row of destination memory 20 can store only two of its bits, as shown in the MSB positions of that row as D7'[1:0]; the remaining 16 bits of the compression value, therefore, wraparound to the next line, that is, they are stored in the LSB positions of the second row of destination memory 20 (shown as D7'[17:2]). Indeed, further in this regard, since this second row stores the 16 bits of D7'[17:2], then the row includes 112 remaining bit locations, which therefore store all of compressed data values D8'[17:0] through D13'[17:0], thereby leaving four bit positions in the MSB locations of that second row—these four bit MSB positions, therefore, store the LSB portion of the next compressed data quantity, namely, D14'[3:0], leaving therefore the remaining 14 bits of D14' to be stored in the LSB positions of the third row of destination memory 20 (see, D'14[17:4], therein). One skilled in the art should appreciate the rest of the FIG. 2 illustration, given these observations.

Having demonstrated an example of the observable patterns and considerations of the preferred embodiment in compressing data from a source memory to a destination memory, the preferred embodiment functionality of mapping the original read data quantity to a compressed data value for writing at a storage address is expressed per the preferred embodiment according to the following three Equations:

$$BitLevelAddress = (ByteAddr * 8) * (CompBitWidth/UncompressedBitWidth) \quad \text{Equation 1}$$

where, and as shown by example later:
ByteAddr (BA), introduced in FIG. 2 as the DATA SAMPLE BYTE ADDRESS, is an address relating to the location in destination memory to which the compressed quantity is to be stored, considering its uncompressed size before compression and the directionality of the read or write, as further evident below;
CompBitWidth (CBW) is the size of the compressed data; and
UncompressedBitWidth (UBW) is the size of the data quantity before compression.

$$CompressedDestinationAddress = floor(BitLevelAddress/DestinationMemoryWidth) \quad \text{Equation 2}$$

where, and as shown by example later:
floor( ) is a known function that selects the quotient only of the division result from BitLevelAddress/DestinationMemoryWidth; and
DestinationMemoryWidth (DMW) is the bit size of each row in the destination memory.

$$CompressedWriteEnableShiftVal = Mod(BitLevelAddress, DestinationMemoryWidth) \quad \text{Equation 3}$$

where, and as shown by example later:
Mod( ) is a known function (modulo) that selects the remainder of the division of BitLevelAddress/DMW.

Note also in connection with Equations 2 and 3 that the operands are typically, in a digital computing system such as digital information system 10, binary numbers (i.e., powers of 2). As such, well-known in the art is that division of a first binary number by another binary number which is power of 2 divisor number may be operationally achieved by shifting the first number an appropriate number of positions, based on the value of the divisor, or alternatively by selecting an appropriate number of bits from the first number (again, based on the value of the divisor), where either the remaining bits after the shift, or the selected bits, represent the quotient of what would be accomplished with a division. Thus, Equation 2 may be achieved in hardware via the bit selection or shift. Similarly, the remainder of such a select/shift "division" may be identified by the lesser significant bit(s) following the selected bits, or the bits that are shifted out so as to leave the quotient bits. Similarly, therefore, Equation 3 may be achieved in hardware as the bits shifted or following (as less significant) the bits from the quotient. For example, if DMW is 128, then the preferred embodiment may take all the MSB bits of the BitLevelAddress other than the LSB 7 bits for CompressedDestinationAddress of Equation 2, and the 7 LSBs are used for CompressedWriteEnableShiftVal of Equation 3. Thus, an alternative preferred embodiment may achieve the functionality of Equations 2 and 3 without actually using a divider.

Equations 1 through 3 are now better understood by returning to some examples of FIG. 2. In a first example, consider again the 32-bit data sample D0[31:0] at the LSB position of source memory 18. BA is determined based on the number of bytes in the uncompressed data quantity, the desired write location of the compressed counterpart, and the ordering of read/write, as will be further evident herein. For D0[31:0], since its counterpart is to be stored at row 0, LSBs positions, then BA is initialized at BA=0. Further for the entire example of FIG. 2, UBW=32 for the 32-bit quantities in source memory 18, and the desired compression to 18 bits means CBW=18, as shown in destination memory 20. Substituting these values into Equation 1, yields the following Equation 1.1:

$$\text{BitLevelAddress} = (0*8)*(18/32) = 0 \qquad \text{Equation 1.1}$$

Next, substituting the Equation 1.1 BitLevelAddress (hereafter, BLA) into Equation 2, yields the following Equation 2.1:

$$\text{CompressedDestinationAddress} = \text{floor}(0/128) = 0 \qquad \text{Equation 2.1}$$

Still further, substituting the Equation 1.1 BLA into Equation 3, yields the following Equation 3.1:

$$\text{CompressedWriteEnableShiftVal} = \text{Mod}(0/128) = 0 \qquad \text{Equation 3.1}$$

The CompressedDestinationAddress (hereafter, CDA) of Equation 2.1 indicates the row (or word) position in destination memory 20 where the compressed counterpart should be written and, as further explored below, the CompressedWriteEnableShiftVal (hereafter, CWESV) indicates a left shift amount, relative to the LSB in the row, that the compressed counterpart is to be written. In the first example of Equations 2.1 and 3.1, both values are 0, so the first compressed counterpart, D0'[17:0], is written in the first row (i.e., row 0) and is unshifted (i.e., CWESV=0) relative to the LSB of that row.

In a second example of Equations 1 through 3, for the row ordered reading in FIG. 2, consider next the read of the 32-bit data quantity D1[31:0], which is in the next most significant position relative to D0[31:0]. For D1[31:0], its BA is increased, relative to the BA for D0[31:0], based on the uncompressed size of the data samples (i.e., four bytes), and given that reading and writing in this example are row ordered. In other words, for the row ordered next read of D1[31:0], the sense of a row-ordered write in row 0 of destination memory 20, then the intended write is four bytes after the previous write of D0'[17:0]; thus, for Equation 1, BA=4, and again for the example of FIG. 2, UBW=32 and CBW=18. Substituting these values into Equation 1, yields the following Equation 1.1:

$$\text{BLA} = (4*8)*(18/32) = 18 \qquad \text{Equation 1.2}$$

Next, substituting the Equation 1.2 BLA into Equation 2, yields the following Equation 2.2:

$$\text{CDA} = \text{floor}(18/128) = 0 \qquad \text{Equation 2.2}$$

Still further, substituting the Equation 1.2 BLA into Equation 3, yields the following Equation 3.2:

$$\text{CWESV} = \text{Mod}(18/128) = 18 \qquad \text{Equation 3.2}$$

The CDA=0 found in Equation 2.2 indicates the compressed counterpart D1'[17:0] should be written into row 0 of destination memory 20, while the CWESV=18 indicates a left shift amount, relative to the LSB in the row, of 18 bits. Thus, as shown in FIG. 2, the 18 LSBs in row 0 of destination memory 20 are occupied by D0'[17:0], while Equations 2.2 and 3.2 then cause a write of the next 18 MSBs with D1'[17:0], that is, per Equation 3.2, D1'[17:0] is written so as to be shifted to the left 18 bits relative to the LSB in row 0, thereby locating D1'[17:0] as shown in FIG. 2.

The above examples illustrate that the positioning of each compressed counterpart Dx'[CBW-1:0] is a function of both CBW (shown in FIG. 2 as COMPRESSION SIZE) and BA (shown in FIG. 2 as DATA SAMPLE BYTE ADDRESS). Indeed, to further illustrate these and other aspects, the following Table 1 lists the resultant calculations of Equations 1 through 3 for each of the data samples Dx[31:0] in source memory 18 and its compressed counterpart Dx'[17:0] in destination memory 20.

TABLE 1

| Data sample | BA | BLA | CDA | CWESV |
|---|---|---|---|---|
| D0 | 0 | 0 | 0 | 0 |
| D1 | 4 | 18 | 0 | 18 |
| D2 | 8 | 36 | 0 | 36 |
| D3 | 12 | 54 | 0 | 54 |
| D4 | 16 | 72 | 0 | 72 |
| D5 | 20 | 90 | 0 | 90 |
| D6 | 24 | 108 | 0 | 108 |
| D7 | 28 | 126 | 0 | 126 |
| D8 | 32 | 144 | 1 | 16 |
| D9 | 36 | 162 | 1 | 34 |
| D10 | 40 | 180 | 1 | 52 |
| D11 | 44 | 198 | 1 | 70 |
| D12 | 48 | 216 | 1 | 88 |
| D13 | 52 | 234 | 1 | 106 |
| D14 | 56 | 252 | 1 | 124 |
| D15 | 60 | 270 | 2 | 14 |
| D16 | 64 | 288 | 2 | 32 |
| D17 | 68 | 306 | 2 | 50 |
| D18 | 72 | 324 | 2 | 68 |
| D19 | 76 | 342 | 2 | 86 |
| D20 | 80 | 360 | 2 | 104 |
| D21 | 84 | 378 | 2 | 122 |
| D22 | 88 | 396 | 3 | 12 |
| D23 | 92 | 414 | 3 | 30 |
| D24 | 96 | 432 | 3 | 48 |
| D25 | 100 | 450 | 3 | 66 |
| D26 | 104 | 468 | 3 | 84 |
| D27 | 108 | 486 | 3 | 102 |
| D28 | 112 | 504 | 3 | 120 |
| D29 | 116 | 522 | 4 | 10 |
| D30 | 120 | 540 | 4 | 28 |
| D31 | 124 | 558 | 4 | 46 |
| D32 | 128 | 576 | 4 | 64 |
| D33 | 132 | 594 | 4 | 82 |
| D34 | 136 | 612 | 4 | 100 |
| D35 | 140 | 640 | 4 | 118 |

Table 1, therefore, confirms the positioning of each 18-bit compressed counterpart Dx'. In addition, note additional observations from its information. First, BA increases by four for each successive data quantity D; this is because each value is read along a row and written along a row or rows—if the data were written as uncompressed, therefore, then each wrote would need to be four bytes after the preceding write, so BA is increased by that needed amount. Second, note that the shifting positions, indicated by CWESV, indicate where the LSB of a compressed counterpart is written, followed by its more significant bits. For example, for data sample D1, the LSB of its compressed counterpart, D1', is written in row 0, shifted left 18 bit positions. Further in this regard, however, note that if a row in destination memory 20 is filled by less than all CBW bits of a compressed counterpart, then its remaining MSB or MSBs will wraparound to the next row in destination memory 20. By way of example, consider the MSBs in row 0, in which FIG. 2 shows are located D7'[1:0]; these bits are also shown in Table 1 as the counterpart to uncompressed data quantity D7, which has CWESV=126; thus, this shift value indicates that D7' is left shifted 126 bits in row 0 of destination memory 20, so that only two bits remain in that row and they are therefore written with the LSBs of D7', namely, D7'[1:0]. The remaining 16 bits of D7', namely, D7'[17:2], wraparound to the next row of destination memory 20, and are therefore shown in the LSB positions of row 1. Similar observations may be made with respect to data samples D14, D21, D28, and D35, and their respective compressed counterparts.

FIG. 3 again illustrates a functional block diagram of source memory 18, destination memory 20, and compression engine 22, using the convention of FIG. 2, but in FIG. 3 an example is presented wherein data is read from source memory 18 from locations that are not contiguous (or having non-sequential addresses). More specifically, in FIG. 3, data is read by column, with the illustration showing the reading of the lowest-ordered column (i.e., column 0) of source memory 18, with each read data then compressed and respective counterparts written in a row-by-row fashion into destination memory 20, again per Equations 1 through 3. Note that such an approach may be required in certain applications that transpose data, that is, reading by column and writing by row, or vice versa. Such applications may include automotive data, color (e.g., RGB) data, and still others.

Figure 3:
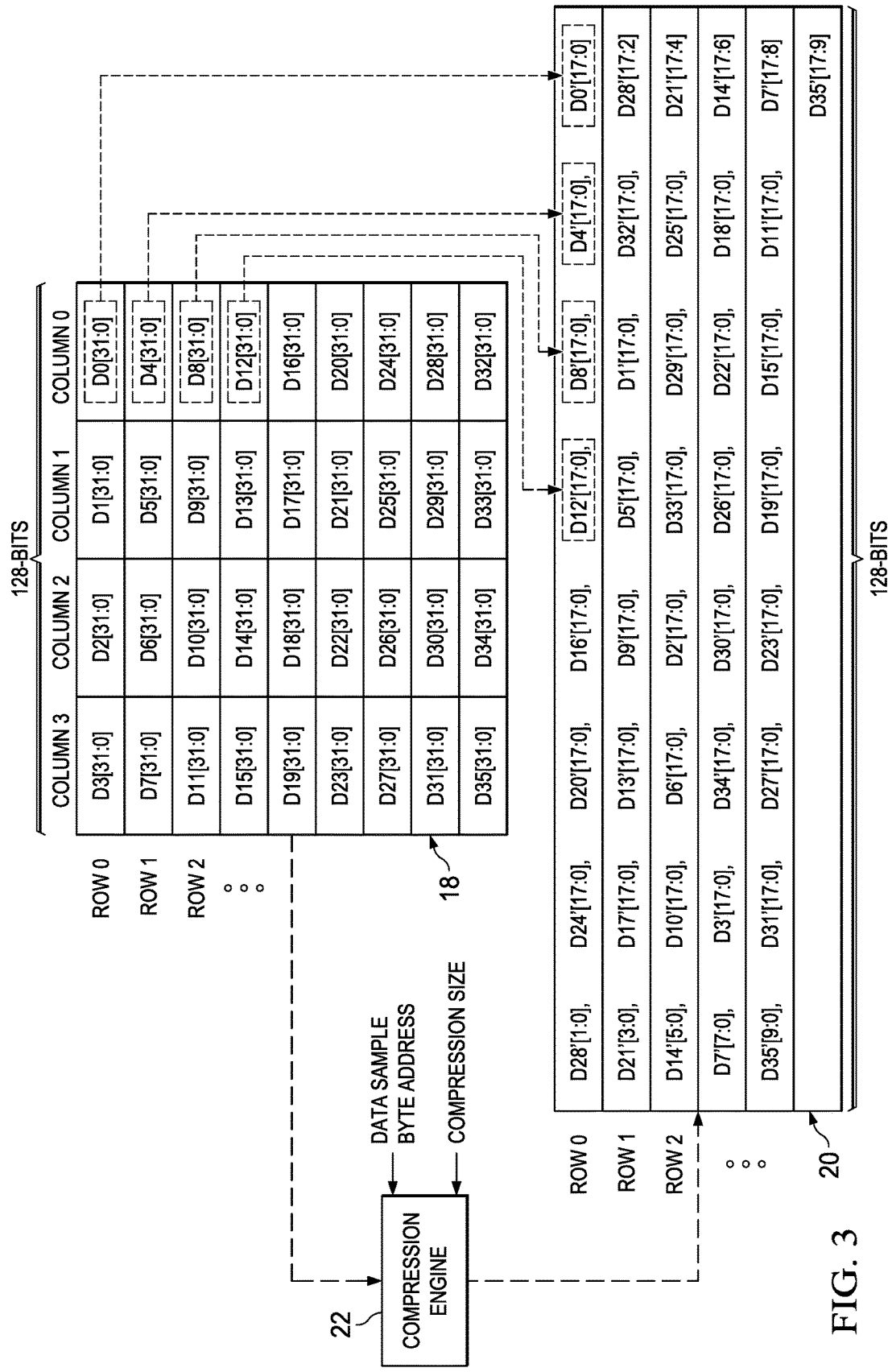
FIG. 3 illustrates a functional block diagram of source memory, destination memory, and compression engine, with column reading from the source memory and compressed row writing into the destination memory.

For the first read data D0 in FIG. 3, the results of Equations 1 through 3 are the same as for the example of FIG. 2. Thus, a compressed data counterpart D0' is written in the LSB positions of destination memory 20. To assist the reader with the relationship between read data and its written compressed counterpart in FIG. 3, a dotted oval is shown in a few instances connecting the read data (e.g., D0) to its compressed counterpart (e.g., D0'), as directed by CDA and CWESV.

Continuing in FIG. 3, since its illustration is intended for columnar reading from source memory 18, then the next read data is D4, in the same column 0 and from the next row (i.e., row 1), as compared to D0. Since FIG. 3 also illustrates the write of the compressed counterpart data in a row-by-row fashion into destination memory 20, then BA is again determined for D4 according to the number of bytes were the data uncompressed, and further in view of the desired row-oriented write. Thus, since the number of uncompressed bytes in this example is four, and since D0' was previously stored with BA=0, then BA for D4 is increased by those four bytes such that BA=4 for this next read data, D4. Note by way of contrast that D4 had a BA=16 in Table 1, whereas in FIG. 3, for D4 its BA=4, since its counterpart compressed data D4'[17:0] is to be written into row 0 of destination memory 20, in the location immediately left of D0'[17:0]. Accordingly, for FIG. 3, then Equations 1 through 3, with respect to D4, are as shown in the following:

$$BLA=(4*8)*(18/32)=18 \quad \text{Equation 1.3}$$

Next, substituting the Equation 1.2 BLA into Equation 2, yields the following Equation 2.2:

$$CDA=\text{floor}(18/128)=0 \quad \text{Equation 2.3}$$

Still further, substituting the Equation 1.2 BLA into Equation 3, yields the following Equation 3.2:

$$CWESV=\text{Mod}(18/128)=18 \quad \text{Equation 3.3}$$

Given the above, for data quantity D4[31:0] and in the columnar-ordered reading of FIG. 3, the compressed 18-bit counterpart, D4'[17:0], is stored in row 0 (CDA=0) and is left shifted 18 bit positions, so as to be the set of MSBs immediately to the left of D0'[17:0]. Again by way of illustration, a dotted oval is shown connecting the sample D1 to its compressed counterpart D1', as directed by CDA and CWESV.

Thea above pattern, demonstrated for D0 and D1, will continue with respect to FIG. 3, so that as subsequent data samples are read along column 0 in source memory 18, their respective compressed counterparts appear at more significant bit positions of row 0 in destination memory 20, until all 128 bits of the row are written, after which the above-described wraparound occurs (e.g., in this example, with respect to compressed counterpart D28'). A few additional dashed ovals are shown to depict this pattern. Given the preceding teachings, therefore, one skilled in the art will appreciate that the determinations of Equations 1 through 3, relative to the reading each column of source memory 18 in FIG. 3, result in the determinations shown in the following Table 2, so as to write counterpart compressed values in a row-by-row orientation into destination memory 20:

TABLE 2

| Data sample | BA | BLA | CDA | CWESV |
|---|---|---|---|---|
| D0 | 0 | 0 | 0 | 0 |
| D4 | 4 | 18 | 0 | 18 |
| D8 | 8 | 36 | 0 | 36 |
| D12 | 12 | 54 | 0 | 54 |
| D16 | 16 | 72 | 0 | 72 |
| D20 | 20 | 90 | 0 | 90 |
| D24 | 24 | 108 | 0 | 108 |
| D28 | 28 | 126 | 0 | 126 |
| D32 | 32 | 144 | 1 | 16 |
| D1 | 36 | 162 | 1 | 34 |
| D5 | 40 | 180 | 1 | 52 |
| D9 | 44 | 198 | 1 | 70 |
| D13 | 48 | 216 | 1 | 88 |
| D17 | 52 | 234 | 1 | 106 |
| D21 | 56 | 252 | 1 | 124 |
| D25 | 60 | 270 | 2 | 14 |
| D29 | 64 | 288 | 2 | 32 |
| D33 | 68 | 306 | 2 | 50 |
| D2 | 72 | 324 | 2 | 68 |
| D6 | 76 | 342 | 2 | 86 |
| D10 | 80 | 360 | 2 | 104 |
| D14 | 84 | 378 | 2 | 122 |
| D18 | 88 | 396 | 3 | 12 |
| D22 | 92 | 414 | 3 | 30 |
| D26 | 96 | 432 | 3 | 48 |
| D30 | 100 | 450 | 3 | 66 |
| D34 | 104 | 468 | 3 | 84 |
| D3 | 108 | 486 | 3 | 102 |
| D7 | 112 | 504 | 3 | 120 |
| D11 | 116 | 522 | 4 | 10 |
| D15 | 120 | 540 | 4 | 28 |
| D19 | 124 | 558 | 4 | 46 |
| D23 | 128 | 576 | 4 | 64 |
| D27 | 132 | 594 | 4 | 82 |
| D31 | 136 | 612 | 4 | 100 |
| D35 | 140 | 630 | 4 | 118 |

Table 2, therefore, confirms the positioning of each 18-bit compressed counterpart Dx' in FIG. 3.

Having described and illustrated the preferred embodiment ability to write compressed data according to a row-by-row ordering into destination memory 20, the preferred embodiments further provide for reading row-by-row (i.e., sequentially addressed) and writing in a non-sequentially addressed manner, such as a generally-columnar ordering, into destination memory 20. By way of introduction, note that the columnar writes are described as "generally-columnar" because, as appreciated below, the compressing of data, by definition, reduces the number of bits stored relative to the originally read data quantities, per data sample. As a result, there is not an exact, symmetric, columnar alignment of different compressed data, as will be evident below. Nonetheless, such writing may be considered to be columnar, or at least out-of row or sequential order, by one skilled in the art, given the teachings as described herein.

FIG. 4 again illustrates a functional block diagram of source memory 18, destination memory 20, and compression engine 22, using the convention of FIGS. 2 and 3, but in FIG. 4 an example is presented wherein data is sampled from source memory 18 along rows but the respective compressed counterparts are stored in locations in destination memory 20 that are not contiguous (or having non-sequential addresses). Note that such an approach also may be required in certain applications that transpose data, as mentioned earlier.

Figure 4:
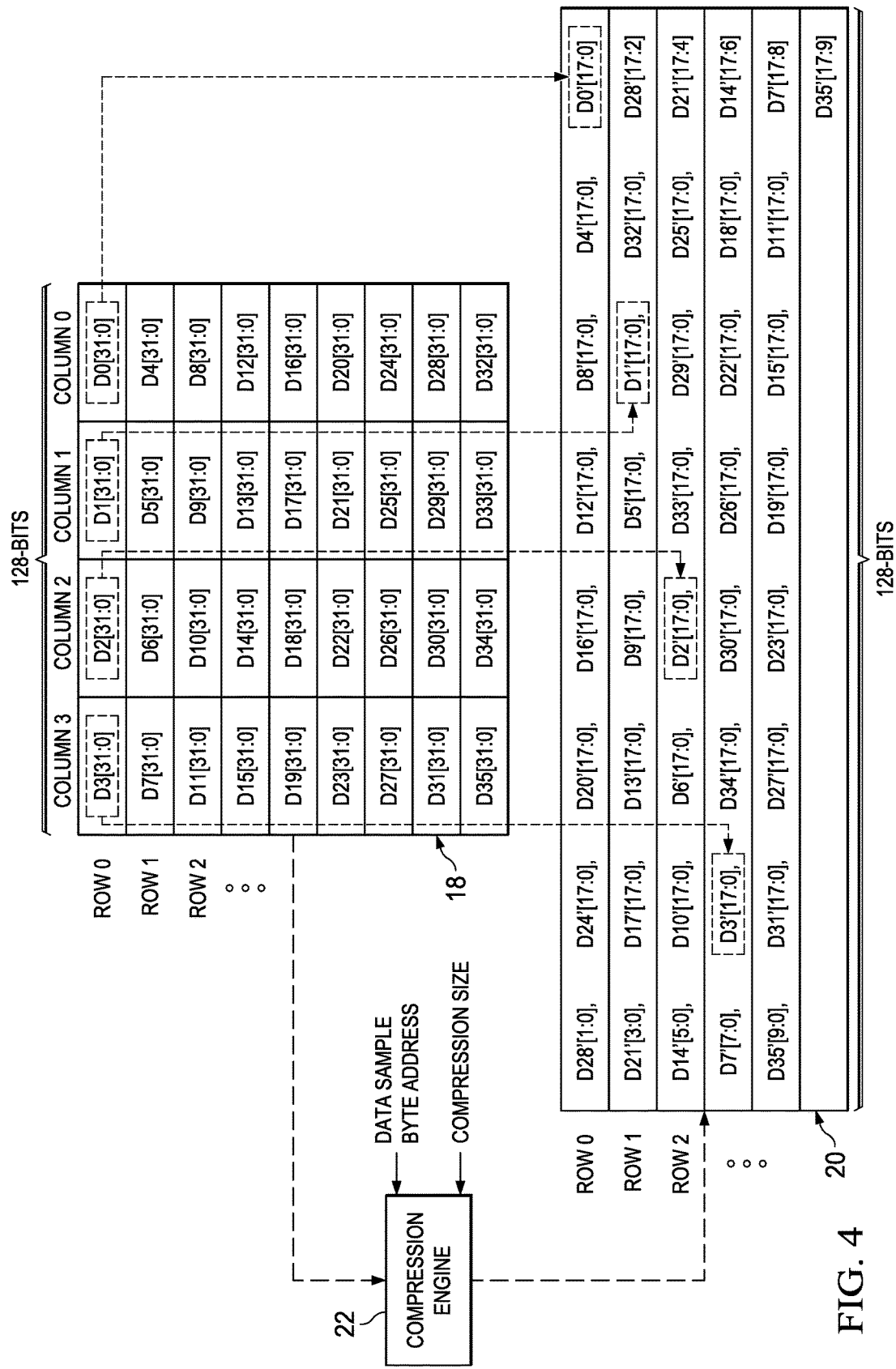
FIG. 4 illustrates a functional block diagram of source memory, destination memory, and compression engine, with row reading from the source memory and compressed generally-columnar or otherwise transposed or out-of-sequential address writing into the destination memory.

For the first sampled data D0 in FIG. 4, the results of Equations 1 through 3 are the same as for the example of FIG. 3. Thus, a compressed counterpart D0' is written in the LSB positions of destination memory 20. As with the earlier convention, the relationship between a read data sample and its written compressed counterpart, in FIG. 4, are shown by dashed ovals and a connecting arrow, where for example such is shown connecting the quantity D0 to its compressed counterpart D0', as directed by CDA and CWESV.

Continuing in FIG. 4, since its illustration is intended for row reading from source memory 18, then the next sampled data is D1. Since FIG. 4, however, illustrates the writes of the compressed counterpart data in a generally columnar fashion, then the value of BA is set taking into account the locations of bytes that would be used if the rows of source memory 18 are transposed to full byte columns in destination memory 20. In this case, therefore, note that column 0 of source memory 18 stores a total of nine data quantities, each having four bytes; thus, these data samples span 36 bytes, if transposed in non-compressed form into a data column. As a result, to determine BA for D1, the 36 bytes corresponding to that transposed column are added to the BA for D0 (which had BA=0), so BA=36 for D1. Thus, for Equation 1, BA=36, and again for the example of FIG. 4, UBW=32 and CBW=18. Substituting these values into Equation 1, yields the following Equation 1.4:

$$BLA = (36*8)*(18/32) = 162 \quad \text{Equation 1.4}$$

Next, substituting the Equation 1.4 BLA into Equation 2, yields the following Equation 2.4:

$$CDA = \text{floor}(162/128) = 1 \quad \text{Equation 2.4}$$

Still further, substituting the Equation 1.4 BLA into Equation 3, yields the following Equation 3.4:

$$CWESV = \text{Mod}(162/128) = 34 \quad \text{Equation 3.4}$$

The CDA found in Equation 2.4 indicates the compressed counterpart D1'[17:0] should be written into row 1 of destination memory 20, while the CWESV of Equation 3.4 indicates a left shift amount, relative to the LSB in the row, of 34 bits. Thus, as shown in FIG. 4, the first 16 LSBs in row 1 of destination memory 20 are occupied by the wraparound bits D28'[17:2] and the next 18 LSBs are occupied by D32'[17:0], for a total of 34 bits, after which is indeed written the compressed data D1'[17:0], matching the results of Equations 2.4 and 3.4.

The above pattern, demonstrated for D0 and D1, will continue with respect to FIG. 4, so that as subsequent data quantities are read along row 0 in source memory 18, and their respective compressed counterparts appear are written at transposed or generally-columnar locations in destination memory 20. Note that the ultimate storage result in destination memory 20 will match that from FIG. 3, that is, the write positions of the compressed counterparts are the same; that result, however, has now been shown to be reachable by reading a column from source memory 18 and writing to a row into destination memory 20 (i.e., FIG. 3), or by reading a row from source memory 18 and writing to a column into destination memory 20 (i.e., FIG. 4). In each case, therefore, a same value of BA is used for a given data quantity, but the manner of sequencing BA differs if source memory 18 is read along columns as in FIG. 3 or along rows as in FIG. 4. In regard to the latter, therefore, a few additional dashed ovals are shown to depict this pattern. Moreover, given the preceding teachings, one skilled in the art will appreciate that the determinations of Equations 1 through 3, relative to reading each row of source memory 18 in FIG. 4, result in the determinations shown in the following Table 3, so as to write compressed counterparts into generally-column ordering in destination memory 20:

TABLE 3

| Data sample | BA | BLA | CDA | CWESV |
| --- | --- | --- | --- | --- |
| D0 | 0 | 0 | 0 | 0 |
| D1 | 36 | 162 | 1 | 34 |
| D2 | 72 | 324 | 2 | 68 |
| D3 | 108 | 486 | 3 | 102 |
| D4 | 4 | 18 | 0 | 18 |
| D5 | 40 | 180 | 1 | 52 |
| D6 | 76 | 342 | 2 | 86 |
| D7 | 112 | 504 | 3 | 120 |
| D8 | 8 | 36 | 0 | 36 |
| D9 | 44 | 198 | 1 | 70 |
| D10 | 80 | 360 | 2 | 104 |
| D11 | 116 | 522 | 4 | 10 |
| D12 | 12 | 54 | 0 | 54 |
| D13 | 48 | 216 | 1 | 88 |
| D14 | 84 | 378 | 2 | 122 |
| D15 | 120 | 540 | 4 | 28 |
| D16 | 16 | 72 | 0 | 72 |
| D17 | 52 | 234 | 1 | 106 |
| D18 | 88 | 396 | 3 | 12 |
| D19 | 124 | 558 | 4 | 46 |
| D20 | 20 | 90 | 0 | 90 |
| D21 | 56 | 252 | 1 | 124 |
| D22 | 92 | 414 | 3 | 30 |
| D23 | 128 | 576 | 4 | 64 |
| D24 | 24 | 108 | 0 | 108 |
| D25 | 60 | 270 | 2 | 14 |
| D26 | 96 | 432 | 3 | 48 |
| D27 | 132 | 594 | 4 | 82 |
| D28 | 28 | 126 | 0 | 126 |
| D29 | 64 | 288 | 2 | 32 |
| D30 | 100 | 450 | 3 | 66 |
| D31 | 136 | 612 | 4 | 100 |
| D32 | 32 | 144 | 1 | 16 |
| D33 | 68 | 306 | 2 | 50 |
| D34 | 104 | 468 | 3 | 84 |
| D35 | 140 | 630 | 4 | 118 |

Table 3, therefore, confirms the positioning of each 18-bit compressed counterpart Dx' in FIG. 4, which is, as described above, the same as FIG. 3 as to the final compressed data positions, but is arrived at via a different sequence, as appreciated by comparing Table 3 with Table 2—those Tables depict the same values, but are organized according to the read/write sequencing of BA, as guided by the orientation of the read from source memory 18 and the write to destination memory 20.

Figure 5:
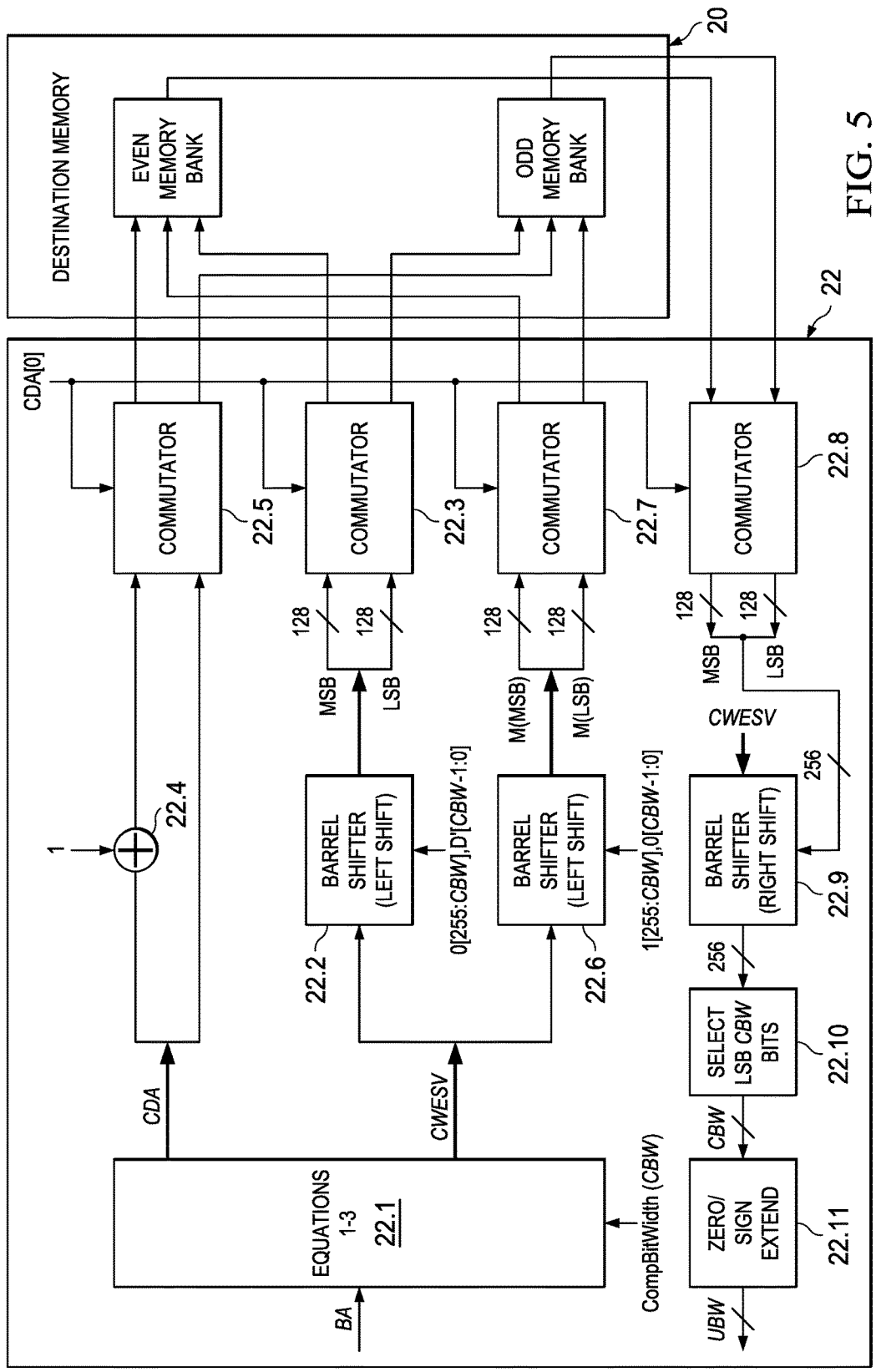
FIG. 5 illustrates an electrical block diagram of additional details of the compression engine from FIG. 1.

FIG. 5 illustrates an electrical block diagram of compression engine 22 from FIG. 1, with sufficient blocks so as to achieve the functionality as described above in connection with FIGS. 2 through 4. Engine 22, as described generally in FIG. 1, is connected to receive values so as to direct the writing of respective compressed counterparts to a destination memory 20. In a preferred embodiment illustrated in FIG. 5, destination memory 20 has two memory banks, an even bank addressable with even addresses and an odd bank addressable with odd addresses, whereby each bank may be written at a same time (e.g., during a same clock cycle) in response to a respective even or odd address, as further appreciated below.

Looking to additional detail of engine 22, it includes an Equations computation block 22.1 that is connected to receive inputs, and to compute the outputs, according to the above-discussed Equations 1 through 3. Thus, engine 22 receives the ByteAddr (BA), such as from DMA controller 16, via bus matrix 14, of FIG. 1, and it also receives the CompBitWidth (CBW), as each of these values may vary. In general, for a given architecture it is expected that the UncompressedBitWidth of Equation 1 will not vary, so it is not shown as a separate input to block 22.1, but it should be understood as available to the block, by programming, hardwire, or as an input, variable or fixed. Block 22.1, therefore, computes BLA from Equation 1, and then per Equations 2 and 3 outputs the values of CDA and CWESV, recalling that such values may include divisions or, alternatively, may be accomplished for power of 2 numbers by selection of certain bits as the floor quotient and other bits as the modulo remainder.

In block 22.1, or elsewhere in compression engine 22 or outside of it, the data D is compressed as desired, such as by reducing the original data number of bits by truncating the MSBs, selecting a subset of bits, or by other algorithms as may be ascertained by one skilled in the art. The result of the compressed data is referenced generally as D', and toward this end, a compressed counterpart quantity D' having CBW bits is shown generally as the LSBs input to a first Barrel Shifter 22.2, with such input designated as D'[CBW-1:0]. Also, for reasons understood below, the remaining MSBs input to Barrel Shifter 22.2 are leading zeroes, and with the total input consisting of 256 bits, then there are a total of 256-CBW leading zeroes, shown in FIG. 5 by the designation of 0[255:CBW]. Moreover, for reasons understood below, the output of Barrel Shifter 22.2 is shown as an input to a Commutator 22.3, separated into some number (e.g., 128) of LSBs and MSBs because in instances of a wraparound write, D' is split so that certain of its MSBs are written into one memory bank while, during the same cycle, certain of its LSBs are written into another memory bank; indeed, note that when a wraparound write is so occurring, and because one part of the write data is in a first bank while the other part of the write data is in a second and different bank, the two banks may be written at the same time (e.g., during a same clock cycle). Also as will be apparent, however, in some instances the entirety of the bits (i.e., LSBs and MSBs) of D' are passed along a single output of Commutator 22.3 into only one of the two memory banks (i.e., either odd or even) of destination memory 20.

CWESV provides an indication of whether a particular counterpart is to be written to a single row or wraps around to two rows. Specifically, if CWESV≤(DMW-CBW), then the counterpart is written to a single row. For example, consider the earlier instances where DMW=128 and CBW=18. So long as CWESV≤(128-18=110), then a written 18-bit counterpart will fit within a single memory row; if, however, CWESV>110 (i.e., CWESV>(DMW-CBW)), then the counterpart will fit partially on one row (i.e., CDA) and wraparound the next row (i.e., CDA+1).

CDA provides an indication of a row to be written for a non-wraparound write to row CDA, or in the case of a wraparound write then one bank is written at row address CDA while another bank is written at row address CDA+1. FIG. 5 diagrammatically depicts these alternatives with CDA input as one addend to an adder 22.4 that has a value of one as a second addend input. The values of CDA and CDA+1 from adder 22.4 inform a Commutator 22.5, which addresses both the odd and even bank of destination memory 20 so as to pass either all bits of the compressed counterpart D' (from Commutator 22.3) to one of an even or odd bank for a non-wraparound write, or in the case of a wraparound write Commutator 22.3 writes DMW-CWESV of the LSBs to row CDA as addressed by Commutator 22.5, and the remaining MSBs to row CDA+1 as addressed by Commutator 22.5.

CWESV is also connected a Write Enable Shift Value to the above-introduced Barrel Shifter 22.2 and also to a second Barrel Shifter 22.6. In general, Barrel Shifter 22.2 outputs 256 bits with the compressed counterpart value of D' appropriately shifted within those 256 bits, and comparably and concurrently, second Barrel Shifter 22.6 outputs a 256 bit mask M to facilitate the writing of the compressed counterpart value of D' into the proper column locations of the one or both of the memory banks in destination memory 20. More particularly, the bits of mask M are shown as 128 MSBs (i.e., M(MSBs)) and 128 LSBs (i.e., M(LSBs)), output from Barrel Shifter 22.6 and then input to a third Commutator 22.7. Third Commutator 22.7 is connected to provide one of either the mask M M(MSBs)) and M(LSBs)) to a first of either the even or odd memory bank while providing the other of those bits to the other bank, as will be further appreciated below.

Each of Commutators 22.3, 22.5, and 22.7 is responsive to the LSB of CDA, indicated in FIG. 5 as CDA[0], so that each Commutator can either directly pass through its inputs to its outputs if CDA[0] is even, or swap those inputs to its outputs if CDA[0] is odd. As appreciated immediately below, these swapping operations facilitate the appropriate writing to either or both the odd and even memory bank in destination memory 20. More particularly, for a given data quantity, block 22.1 determines the values CWESV and CDA, in response to BA, CBW, and as mentioned above, UBW. In general, for a compressed counterpart D' to be written to a single row in destination memory 20, then the combination of Commutators and Barrel Shifters will address the appropriate odd or even bank of destination memory 20, based on bit CDA[0]; in contrast, if a compressed data quantity D' is to wraparound, then its DWM-CWESV LSBs are written to a row in one bank in destination memory 20, while its remaining MSBs are simultaneously written to a next addressable row (i.e., CDA+1) in the other bank in destination memory 20.

In greater detail, a write to a single memory bank is as follows. The compressed data counterpart D' is shifted to the left a total number of CWESV positions by Barrel Shifter 22.2 (with zeroes also shifted in from the left, after the LSB of D'), and the shifted value is provided to Commutator 22.3. Similarly, the mask M is created by Barrel Shifter 22.6, which shifts values of 0 to the left a total number of CWESV positions, leaving values of 1 in its remaining MSBs and also to the right of the left-shifted LSBs, so that a mask M is provided to Commutator 22.7, where that mask will have a number CBW values of 0 appropriately shifted by CWESV, with its remaining bits equal to 1. Lastly, the value of CDA[0] indicates if the write is to either the even memory bank or the odd memory bank, with the correct one of those banks thereby addressed by Commutator 22.5, while at the same time Commutator 22.3 provides the left shifted D' data and Commutator 22.7 provides the mask M; the mask M thereby enables the columns of the corrected target memory bank (i.e., either odd or even) by applying to them an active low value of 0, while the other columns of that target memory bank are at the same time disabled by the mask M by applying an active low disable value of 1. Note, therefore, that mask M enables bit column positions in the memory to be written in the locations of the 0's, while the remaining 1's from Barrel Shifter 22.6 and Commutator 22.7 cause any other bit column positions to remain unaffected by the write—note, therefore, that mask M is an active low enabled signal, but of course a complementary approach also may be implemented. In all events, therefore, in response to the preceding, the compressed data counterpart D' is appropriately written to the proper columns only within the selected memory bank.

In greater detail, a wraparound write, that is, concurrently to both memory banks, is as follows. Again the compressed data counterpart D' is shifted to the left a total number of CWESV positions by Barrel Shifter 22.2, and in the case of a wraparound shift, then CWESV>DMW-CBW, so in the present example CWESV>128-18, so the value to Barrel Shifter 22.2 is shifted accordingly and then provided to Commutator 22.3. Similarly, the mask M is created by Barrel Shifter 22.6, which shifts values of 0 to the left a total number of CWESV positions, leaving values of 1 in its remaining MSBs and also to the right of the left-shifted LSBs, and the mask M is provided to Commutator 22.7. Lastly, the value of CDA[0] indicates a first of either the even memory bank or the odd memory bank that is to receive the LSBs of the wraparound write (i.e., as indicated by CDA), and the MSBs will be written to a second of those memory banks as indicated by CDA+1, the latter address provided by adder 22.4; in other words, Commutator 22.5 will apply address CDA to the one of even or odd memory bank so that bank will be written with the LSBs of the wraparound write and it will apply the address of CDA+1 to the other of the odd or even memory bank, so that bank will be written with the MSBs of the wraparound write. At the same time, Commutator 22.3 provides the LSBs of the left shifted D' data to the memory bank addressed by CDA and the MSBs of the left shifted D' data to the memory bank addressed by CDA+1, while Commutator 22.7 provides a first portion of the mask M, corresponding to the LSBs of the left shifted D' data to the memory bank addressed by CDA and a second portion of the mask M, corresponding to the MSBs of the left shifted D' data, to the memory bank addressed by CDA+1. Here, therefore, the mask M thereby enables the appropriate columns of each target memory bank, by applying to them an active low value of 0 to enable only the bit positions corresponding to the wraparound compressed data counterpart. In this example, therefore, Commutator 22.7 splits mask M so that a first number of DMW-CWESV mask LSBs corresponding to the LSBs of D', are used to mask row CDA in one row of either the odd or even bank in destination memory 20, while the remaining MSBs of mask M, corresponding to the MSBs of D', are used to mask the write to a next addressable row (i.e., CDA+1), in the other of the odd or even bank in destination memory 20. In all events, the masking is such that the write of D' is only to the bit column positions to where D' should be stored, while other data, if any, already on the row(s) in destination memory 20, will be unaffected by the write of D'. These aspects are further explored below, by way of examples.

As an example of operation of block 22 in FIG. 5, consider Table 1, and the sampled data D1. Block 22.1 computes the values in the row of Table 1 corresponding to D1, and those values are distributed as shown in FIG. 5. For D1 in Table 1, CDA=0, thereby indicating that the compressed counterpart, D1', is to be written starting at row 0, and with a bit shift of CWESV=18. Because CWESV is less than (or equal to) 128-(the CDW of 18)=110, then it is known that the entire compressed counterpart, D1' is to be written to a single line in destination memory 20. Thus, all bits of D1 are provided as part of the LSBs on a single line to Commutator 22.3, and in response to CDA being even, Commutator 22.5 applies the CDA address to the even memory bank of destination memory 20; at the same time, Barrel Shifter 22.6 provides the LSBs of mask M to Commutator 22.7, which also responds to CDA being even by outputting the LSBs of mask M to the same (i.e., even) memory being written. Moreover, mask M is shifted by Barrel Shifter 22.6 in response to CWESV=18, creating in the LSBs of the mask 128 values of 1, with the exception of 18 values of 0 at bit positions [35:18]. Note also that the output of Barrel Shifter 22.6 is shown as including 128 LSBs and 128 MSBs (i.e., a total of 256 bits), so that it may provide a mask to up to two successive rows (each having 128 bits) in destination memory 20, so as to accommodate a wraparound write, when necessary. Thus, the output of Commutator 22.7 is an active low write enable signal (supported by most memories) so that the bit positions that receive a mask value of 0 will be enabled for write, while the bit positions that receive a mask value of 1 will be disabled from writing. In any event, therefore, the value D1'[17:0] will be written as shown in FIG. 2.

As another example of the operation of block 22 in FIG. 5, consider Table 1, and the sampled data D7; recall also from FIG. 2 that the compressed counterpart D7', is a wraparound write. Thus, again block 22.1 computes the values in the row of Table 1 corresponding to D7, which again is CDA=0, indicating that the compressed counterpart, D1', is to be written starting at row 0. However, block 22.1 also determines that the bit shift of CWESV=126; thus, CWESV is greater than 128-(the CDW of 18)=110 then it is known that the compressed counterpart, D7' is to be written in wraparound fashion, such that its DMW-CWESV LSBs (e.g., 128-126=2) are written to row CDA, while its remaining MSBs are written to row CDA+1. Toward this end, Barrel Shifter 22.6 shifts D7' so as to output D7'[1:0] to a first input of Commutator 22.7 and D7'[17:2] to a second input of Commutator 22.7 Next, Commutator 22.7 responds to CDA[0] being even so that the input LSBs are connected to the even memory bank while the input MSBs are connected to the odd memory bank. At the same time, Barrel Shifter 22.6 provides mask M to Commutator 22.7, which likewise provides the 128 LSBs (shown as M(LSB)) of that mask to the write enable of the even memory bank, while it provides the MSBs of that mask (shown as M(MSB)) to the write enable of the odd memory bank. Accordingly, in a single write cycle, D7'[1:0] is written to the even memory bank and shifted by CWESV=116 bits, while D7'[17:2] is written to the odd memory bank, starting at its LSB position.

Compression engine 22 of FIG. 5 further includes blocks along the path shown near the bottom of the figure to read and decompress the previously-stored compressed counterpart data. Specifically, each memory bank in destination memory 20 is connected as an input that can be read into a Commutator 22.8; thus, a line (e.g., of DMW=128) of either or both memory banks can be can be read into Commutator 22.8 in a single clock cycle. Commutator 22.8 also can pass through or switch its inputs to alternative outputs in response to the LSB of CDA, shown as CDA[0]. Commutator 22.8 therefore outputs up to 256 bits to a Barrel Shifter 22.9, which is operable to right shift its input value a number of positions indicated by CWESV. The output of Barrel Shifter 22.9 is connected to an LSB Select block 22.10, which is operable to select CBW bits from the right shifted value provided by Barrel Shifter 22.9, and those bits are output to a Zero/Sign Extend block 22.11. Block 22.11 pads zeros at the bit positions that were dropped when the data counterpart was compressed; thus, where the compression dropped a number of MSBs, then for unsigned numbers block 22.11 pads zeroes back into the dropped positions. Of course, if the original compression dropped certain LSBs (either alone or in addition to certain MSBs), then block 22.11 is operable to pad those LSB positions also with a value of zero. Moreover, for the MSB side bit padding, if the original data was 2's complement data, then the preferred embodiment can pad the selected MSBs with the MSB bit of the data that is read back which is therefore equal to sign extension in for such signed 2's complement notation.

From the above, various embodiments provide improvements to memory compression of data. Circuitry is described in FIG. 5 from which: (i) as shown in connection with FIG. 2, data may be read in a row orientation with compressed counterparts written also in a row orientation; or (ii) as shown in connection with FIG. 3, data may be read in a column orientation with compressed counterparts written in a row orientation; or (iii) as shown in connection with FIG. 4, data may be read in a row orientation with compressed counterparts written in a generally-columnar orientation having successive writes to addresses that are non-sequential. Thus, the preferred embodiments permit selection of any N bits out of each sample of size M bits where N≤M, and the selected bits may be written in various fashions, including writing successive compressed data in a non-sequential order. Similarly, the preferred embodiments permit de-compressing previously compressed data counterparts. Further, various aspects have been described, and still others will be ascertainable by one skilled in the art from the present teachings. Also ascertainable by one skilled in the art is that the preferred embodiments provide various advantages. For example, a single data quantity may be read and its compressed counterpart written without the use of a multiple-quantity buffer as in the prior art. As another benefit, therefore, the preferred embodiment permits compression without a history or delay of successive compressed values prior to a memory write. As still another benefit, the preferred embodiment permits reading of original data, and writing of compressed counterparts, to non-sequential addresses. As yet another benefit, the preferred embodiment may be implemented with differing memory sizes (affecting DMW), as well as differing values of CBW and UBW (with 18 and 32 only used above by ways of example). Still others will be further determined by one skilled in the art. Moreover, while various embodiments have been provided, one skilled in the art may adjust various measures and architectures according to application and other considerations, such as memory size, compression size, block architecture, and the like. Still further, while various alternatives have been provided according to the disclosed embodiments, still others are contemplated and yet others can ascertained by one skilled in the art. Given the preceding, therefore, one skilled in the art should further appreciate that while some embodiments have been described in detail, various substitutions, modifications or alterations can be made to the descriptions set forth above without departing from the inventive scope, as is defined by the following claims.

The invention claimed is:

1. A digital data storage and retrieval system, comprising:
  a first memory for storing a plurality of data quantities, wherein each data quantity, in the plurality of data quantities, consists of a first number of bits;
  a second memory for storing a plurality of compressed data quantities, wherein each compressed data quantity, in the plurality of compressed data quantities, consists of a second number of bits that is less than the first number of bits;
  circuitry for reading data quantities from the first memory; and
  circuitry for writing compressed data quantities, corresponding to respective read data quantities, to non-sequential addresses in the second memory;
  wherein the circuitry for reading data quantities from the first memory is for reading along a read orientation selected from one of row-orientation or column-orientation from the first memory, and wherein the circuitry for writing compressed data quantities in the second memory is for writing along a write orientation in the second memory that differs from the read orientation.

2. The system of claim 1 further comprising:
  circuitry for reading compressed data quantities from the second memory; and
  circuitry for writing decompressed data quantities, corresponding to respective read compressed data quantities, to non-sequential addresses in the first memory.

3. The system of claim 2, wherein the circuitry for writing decompressed data quantities further comprises circuitry for adding bit values to each read compressed data quantity.

4. The system of claim 3, wherein the circuitry for adding bit values to each read compressed data quantity comprises circuitry for extending an MSB of a compressed data quantity to one or more bit MSB bit positions of a 2's complement decompressed value.

5. The system of claim 3, wherein the circuitry for adding bit values to each read compressed data quantity comprises circuitry for passing a value of zero to one or more bit MSB bit positions of a decompressed value.

6. The system of claim 1, wherein the read orientation comprises row orientation and the write orientation comprises generally-columnar orientation.

7. The system of claim 1, wherein the read orientation comprises row orientation and the write orientation comprises an orientation wherein successive writes are to non-sequential addresses in the second memory.

8. The system of claim 1, wherein the second memory comprises:
  a first memory block addressable only with even addresses; and
  a first second memory block addressable only with odd addresses.

9. The system of claim 8, wherein the circuitry for writing is for selectively writing a first portion of a compressed data quantity to the first memory block and, at a same time, writing second portion of the compressed data quantity to the second memory block.

10. The system of claim 1 further comprising circuitry for reading compressed data quantities from the second memory.

11. The system of claim 10 further comprising, circuitry for writing decompressed data quantities, corresponding to respective read compressed data quantities, to non-sequential addresses in the first memory.

12. The digital data storage and retrieval system of claim 1 comprising a processor, wherein the first memory is a first cache memory of the processor and the second memory is a second cache memory of the processor.

13. The digital data storage and retrieval system of claim 12, wherein the first cache memory is a lower level cache than the second cache memory.

14. The digital data storage and retrieval system of claim 13, wherein the first cache memory is a level one (L1) cache and the second memory is one of a level two (L2) or level three (L3) cache.

15. A digital data storage and retrieval system, comprising:
- a first memory that stores a plurality of data quantities, wherein each data quantity, in the plurality of data quantities, consists of a first number of bits;
- a second memory that stores a plurality of compressed data quantities, wherein each compressed data quantity, in the plurality of compressed data quantities, consists of a second number of bits that is less than the first number of bits;
- circuitry that reads data quantities from the first memory;
- circuitry that writes compressed data quantities, corresponding to respective read data quantities, to non-sequential addresses in the second memory; and
- a barrel shifter for outputting a mask;
- wherein the circuitry for writing writes to a destination location at a bit position in a row in the second memory in response to the mask.

16. The system of claim 15, wherein the circuitry that reads data quantities from the first memory reads the data quantities along a read orientation selected from one of a row-orientation or a column orientation, and wherein the circuitry that writes the compressed data quantities in the second memory writes the compressed data quantities in a write orientation that differs from the read orientation.

17. The system of claim 16, wherein the read orientation is a row orientation and the write orientation is a generally-columnar orientation.

18. A digital data storage and retrieval system, comprising:
- a first memory for storing a plurality of data quantities, wherein each data quantity, in the plurality of data quantities, consists of a first number of bits;
- a second memory for storing a plurality of compressed data quantities, wherein each compressed data quantity, in the plurality of compressed data quantities, consists of a second number of bits that is less than the first number of bits;
- circuitry for reading data quantities from the first memory;
- circuitry for writing compressed data quantities, corresponding to respective read data quantities, to non-sequential addresses in the second memory; and
- circuitry for determining a bit level address in response to the byte address, the first number, and the second number;
- wherein the circuitry for writing is for writing to a destination location in the second memory in response to a byte address, the first number, and the second number; and
- wherein the circuitry for writing is for writing to the destination location at a row in the second memory further in response to a floor function of a ratio of the bit level address and a row width of the second memory.

19. A digital data storage and retrieval system, comprising:
- a first memory for storing a plurality of data quantities, wherein each data quantity, in the plurality of data quantities, consists of a first number of bits;
- a second memory for storing a plurality of compressed data quantities, wherein each compressed data quantity, in the plurality of compressed data quantities, consists of a second number of bits that is less than the first number of bits;
- circuitry for reading data quantities from the first memory;
- circuitry for writing compressed data quantities, corresponding to respective read data quantities, to non-sequential addresses in the second memory; and
- circuitry for determining a bit level address in response to the byte address, the first number, and the second number;
- wherein the circuitry for writing is for writing to a destination location in the second memory in response to a byte address, the first number, and the second number; and
- wherein the circuitry for writing is for writing to the destination location at a bit position in a row in the second memory further in response to a modulo function of the bit level address relative to a row width of the second memory.

* * * * *